United States Patent
Graf

(10) Patent No.: US 10,753,983 B2
(45) Date of Patent: Aug. 25, 2020

(54) METHOD FOR DETERMINING A FAULT STATE OF A BATTERY, A BATTERY SENSOR AND A VEHICLE ONBOARD POWER SUPPLY SYSTEM

(71) Applicant: Continental Automotive GmbH, Hannover (DE)

(72) Inventor: Hans-Michael Graf, Regensburg (DE)

(73) Assignee: Continental Automotive GmbH (DE)

( * ) Notice: Subject to any disclaimer, the term of this patent is extended or adjusted under 35 U.S.C. 154(b) by 167 days.

(21) Appl. No.: 16/068,209

(22) PCT Filed: Feb. 20, 2017

(86) PCT No.: PCT/EP2017/053780
§ 371 (c)(1),
(2) Date: Jul. 5, 2018

(87) PCT Pub. No.: WO2017/162384
PCT Pub. Date: Sep. 28, 2017

(65) Prior Publication Data
US 2019/0018068 A1      Jan. 17, 2019

(30) Foreign Application Priority Data
Mar. 24, 2016 (DE) .......................... 10 2016 204 944

(51) Int. Cl.
*G01R 31/389* (2019.01)
*G01R 31/3842* (2019.01)
(Continued)

(52) U.S. Cl.
CPC .......... *G01R 31/389* (2019.01); *B60R 16/033* (2013.01); *G01R 27/08* (2013.01); *G01R 31/3648* (2013.01); *G01R 31/3842* (2019.01)

(58) Field of Classification Search
CPC .............. G01R 31/385; G01R 31/3842; G01R 31/389; G01R 31/3648; G01R 31/392;
(Continued)

(56) References Cited

U.S. PATENT DOCUMENTS

| | | | |
|---|---|---|---|
| 6,331,762 B1* | 12/2001 | Bertness | ............ G01R 31/3648 320/134 |
| 7,898,263 B2* | 3/2011 | Ishida | .................... H01M 10/48 324/430 |
| 8,164,343 B2 | 4/2012 | Bertness | |
| 8,306,690 B2* | 11/2012 | Bertness | ............... B60L 3/0046 701/34.4 |
| 8,552,688 B2 | 10/2013 | Ueda et al. | |
| 9,274,157 B2* | 3/2016 | Bertness | ................. B60L 1/003 |
| 9,494,653 B2 | 11/2016 | Okaniwa et al. | |

FOREIGN PATENT DOCUMENTS

| | | |
|---|---|---|
| CN | 101592713 A | 12/2009 |
| DE | 102010000889 A1 | 7/2011 |
| DE | 102013002989 A1 | 8/2013 |
| WO | 2010122255 A1 | 10/2010 |

OTHER PUBLICATIONS

German Search Report for German Application No. 10 2016 204 944.5, dated Nov. 10, 2016, with partial translation—9 pages.
(Continued)

*Primary Examiner* — Vinh P Nguyen
(74) *Attorney, Agent, or Firm* — RatnerPrestia

(57) ABSTRACT

A method for determining a fault state of a battery, which method is based on a calculation of a differential conductance. An associated battery sensor and to an associated onboard power supply system is also disclosed.

18 Claims, 2 Drawing Sheets

(51) Int. Cl.
  *B60R 16/033* (2006.01)
  *G01R 27/08* (2006.01)
  *G01R 31/36* (2020.01)
(58) Field of Classification Search
  CPC .............. G01R 19/2513; G01R 21/133; G01R
    31/006; G01R 27/08; G01R 31/364;
    G01R 31/382; G01R 31/40; G01R
    31/3647; G01R 31/007; G01R 31/374;
    G01R 31/371; B60R 16/033; B64G 1/42;
    B64G 1/423; B64G 7/00; B60L
    2240/545; B60L 3/0046; B60L 3/12;
    B60L 50/62; B60L 50/66; B60L 53/65;
    B60L 53/80; B60L 58/18; B60L 58/21;
    B60L 58/22; B60L 2250/10; B60L
    2260/46; B60L 2260/56; B60L 58/12;
    B60L 58/16
  See application file for complete search history.

(56) References Cited

OTHER PUBLICATIONS

International Search Report and Written Opinion for International Application No. PCT/EP2017/053780, dated Jun. 14, 2017—7 pages.
Chinese Office Action for Chinese Application No. 201780018047.2, dated Mar. 11, 2020, 14 pages.

\* cited by examiner

METHOD FOR DETERMINING A FAULT STATE OF A BATTERY, A BATTERY SENSOR AND A VEHICLE ONBOARD POWER SUPPLY SYSTEM

CROSS REFERENCE TO RELATED APPLICATIONS

This application is the U.S. National Phase Application of PCT/EP2017/053780, filed Feb. 20, 2017, which claims priority to German Patent Application No. 10 2016 204 944.5, filed Mar. 24, 2016, the contents of such applications being incorporated by reference herein.

FIELD OF THE INVENTION

The invention relates to a method for determining a fault state of a battery or the connection points thereof to an onboard power supply system. The invention further relates to a battery sensor, which is configured to carry out such a method. The invention also relates to a vehicle onboard power supply system comprising such a battery sensor.

BACKGROUND OF THE INVENTION

In a motor vehicle with a classic onboard power supply system, only one battery is typically available, which battery can be embodied, in particular, in the form of a known car battery, that it to say a rechargeable battery. This battery typically supplies energy to all loads, including the starter, if a generator does not deliver any energy. In the case of a running internal combustion engine, however, typically two redundant electrical energy sources are available, namely the battery and also a generator driven by the internal combustion engine. If one of the energy sources fails, the respectively other source can thus continue to supply power to the onboard power supply system.

In recent years, automatic stop-start systems, which switch off the internal combustion engine in the case of very low speeds of the motor vehicle, have been built into motor vehicles for reasons of consumption minimization. As a result thereof, the generator is omitted in the case of a switched-off internal combustion engine as the second, redundant current source. However, should the battery fail at the same time, a safe restart of the internal combustion engine would not be possible. This failure can also endanger, in particular, the safety of the vehicle, the vehicle occupants and further road users, for example when the vehicle has come to a standstill at a railroad crossing.

In order to minimize the risk of a battery failure, motor vehicles with stop-start systems are usually equipped with battery sensors, in particular intelligent battery sensors, which make it possible to monitor the battery and hence the ability of the motor vehicle to start. Should a weak battery be identified, the internal combustion engine is not deactivated. Possible causes for a sudden failure of the battery can be, for example, a break in the intercell connector (electrical connection between two cells of the battery), a drop in the positive or the negative pole terminal of the battery poles (in the case of insufficient press-contact), or melting through of the pole shank (between the pole and the first/last cell) due to thermal overloading.

SUMMARY OF THE INVENTION

An aspect of the invention aims to provide a method that can be used to identify a corresponding fault state. In particular, provision can be made of a method that makes it possible to identify within a battery sensor that the connection between the battery ground cable and the positive pole terminal acquires a high impedance while the generator delivers current. In this case, the focus is on a battery sensor, which is constructed on the negative side of a battery and is connected to another control device via LIN. There are also aspects of the invention to provide an associated battery sensor and an associated onboard power supply system.

The content of the claims is incorporated in the content of the description by express reference.

An aspect of the invention relates to a method for determining a fault state of a battery or the connection points thereof to an onboard power supply system, which method comprises the following steps:

measuring at least one voltage change of the battery,
measuring at least one current change of the battery,
calculating a differential conductance based on the current change and the voltage change and
ascertaining the fault state when the differential conductance undershoots a conductance threshold value.

This procedure has proven to be particularly advantageous for typical situations, as will be described in more detail further below.

In particular, the method according to an aspect of the invention prevents errors from arising in the digital processing, in particular on account of a possible division by zero, in the case of a resistance that tends toward infinity in the event of a high-impedance battery. The conductance prevents this problem by behaving in a reciprocal manner to the resistance.

A voltage change and/or current change can be, in particular, band-pass-filtered.

In particular, the fault state can correspond to a failure or a high-impedance state of the battery or the connection lines thereof. This makes it possible to advantageously identify a fault state of this kind.

The method is preferably carried out at a battery sensor, which is connected to the battery.

The connection to the battery is, in particular, the desired state, wherein, in the case of high impedance, the connection possibly likewise has a high impedance or is no longer present at all. It should thus be understood that the mentioned state relates, in particular, to the normal state, that is to say without the fault state or high impedance.

The voltage change and the current change are preferably measured over an identical period of time. This can mean, in particular, that the voltage change and the current change are measured over a period of time that is equally long in each case. It can also mean that end points and/or starting points of the respective measurement are identical in terms of time.

The voltage change can be calculated, in particular, as the difference between a second voltage value and a first voltage value measured temporally before said second voltage value. The current change can be calculated, in particular, as the difference between a second current value and a first current value measured temporally before said second current value. The temporal spacing between the first voltage value and the second voltage value on the one hand and the first current value and the second current value on the other hand can be, in particular, identical. A time at which the first voltage value is measured can also correspond to the time at which the first current value is measured. The time at which the second voltage value is measured can likewise correspond to the time at which the second current value is measured.

The current change and/or the voltage change can be measured, in particular, at a frequency between 50 Hz and 20 kHz, preferably between 200 Hz and 8 kHz, particularly preferably 1 kHz. Such frequencies have been found to be advantageous in practice.

The differential conductance can be calculated, in particular, by division of the current change by the voltage change. This corresponds to a typical and simple calculation of a conductance.

The differential conductance can also be calculated by means of a least-squares analysis, in particular over a plurality of current changes and/or voltage changes. A more accurate conductance can thus be calculated using a certain homogenization process or average value formation.

The disabling of an internal combustion engine can advantageously be deactivated in response to the ascertainment of the fault state. This prevents breakdowns when the battery has a high impedance and the engine could thus no longer be started.

The differential conductance is preferably calculated only when the voltage change is above a voltage change threshold value. This prevents divisions by zero or excessively high values of the conductance, which could cause problems in the digital processing.

The differential resistance can be calculated, in particular, based on the current change and the voltage change when the current change is above a current change threshold value, wherein the fault state is ascertained when the differential resistance exceeds a resistance threshold value. A resistance can thus also be advantageously used in the context of the method for identifying a fault state.

The use of the current change threshold value can again prevent a division by zero or a similar problem in the digital processing.

According to one embodiment of the method, both a resistance intermediate value and a conductance intermediate value can be calculated and the differential resistance is then calculated by addition of the resistance intermediate value and the inverse of the conductance intermediate value and division of the result by the number 2.

A resistance intermediate value and also a conductance intermediate value can likewise be calculated and the differential conductance is calculated by addition of the conductance intermediate value and the inverse of the resistance intermediate value and division of the result by the number 2.

Embodiments of this kind can provide a greater degree of precision.

An aspect of the invention further relates to a battery sensor, which is designed to be connected to a battery and preferably also to a vehicle chassis, wherein said vehicle chassis typically represents the ground. The battery sensor is configured to carry out a method according to an aspect of the invention. To this end, the battery sensor can have, in particular, processor means and storage means, the storage means storing program code, during the execution of which the processor means carry out a method according to an aspect of the invention or behave accordingly. In respect of the method, reference can be made to all of the described embodiments and variants.

An aspect of invention further relates to a nonvolatile, computer-readable storage medium on which program code is stored, during the execution of which a processor carries out a method according to an aspect of the invention. In respect of the method, reference can be made to all of the described embodiments and variants.

An aspect of invention further relates to a vehicle onboard power supply system comprising a battery and a battery sensor according to an aspect of the invention connected to the battery and to a generator, which is preferably driven by an internal combustion engine. The battery, the battery sensor and the generator have in this case a common positive line and preferably also a common ground. The ground can be, in particular, a vehicle chassis.

By means of the vehicle onboard power supply system according to an aspect of the invention, the advantages of a method and of a battery sensor, respectively, that are described further above can be used advantageously for a vehicle onboard power supply system. In respect of the battery sensor and the method, respectively, reference can be made to all of the described embodiments and variants.

BRIEF DESCRIPTION OF THE DRAWINGS

Further features and advantages will be gathered by a person skilled in the art from the exemplary embodiment described below with reference to the appended drawing, in which.

DETAILED DESCRIPTION OF THE PREFERRED EMBODIMENTS

Figure 1:
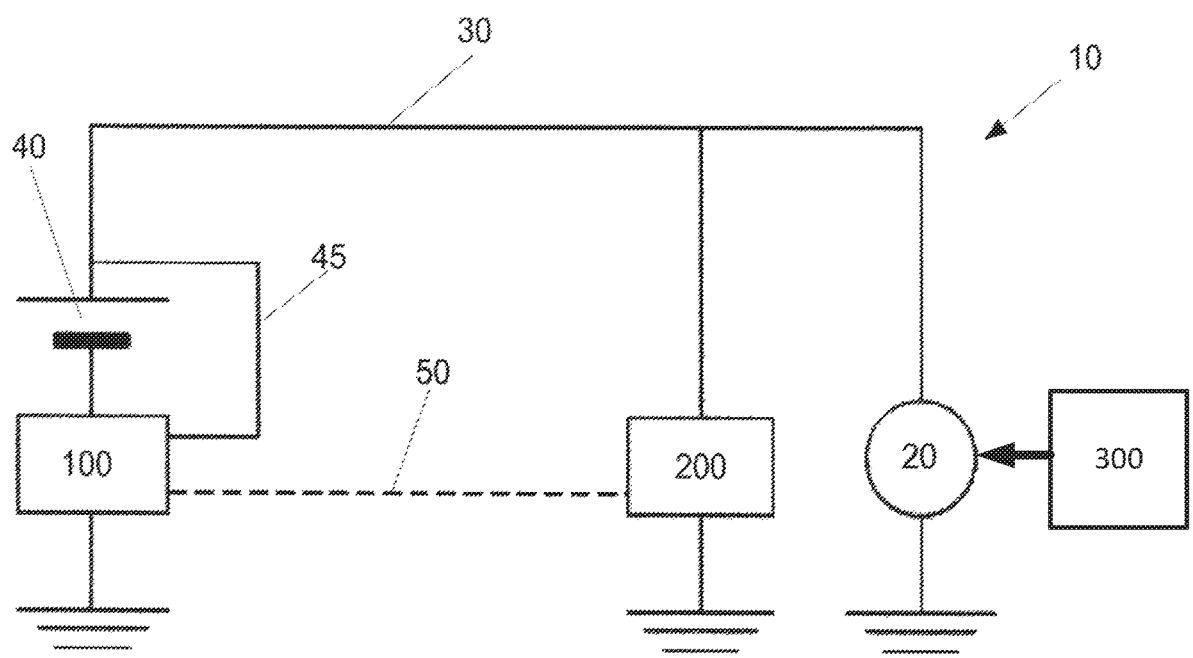
FIG. 1: shows a vehicle onboard power supply system in a normal state.

FIG. 1 shows a vehicle onboard power supply system 10 comprising a generator 20, a battery 40, a battery sensor 100, a control apparatus 200 and an internal combustion engine 300. The battery 40, the control apparatus 200 and the generator 20 are interconnected with one another via a common positive line 30. The battery sensor 100 is connected directly to the negative pole of the battery 40 and is also connected to the positive pole of the battery 40 via a battery supply line 45 in order to ensure a power supply to the battery sensor 100. A connecting line 50 is further provided between the battery sensor 100 and the control apparatus 200. The battery sensor 100 and the control apparatus 200 can thus communicate with one another, as a result of which, for example, respective measured voltage, current or temperature values can be transmitted from the battery sensor 100 to the control apparatus 200. It is also possible for the battery sensor 100 to be controlled by the control apparatus 200.

Figure 2:
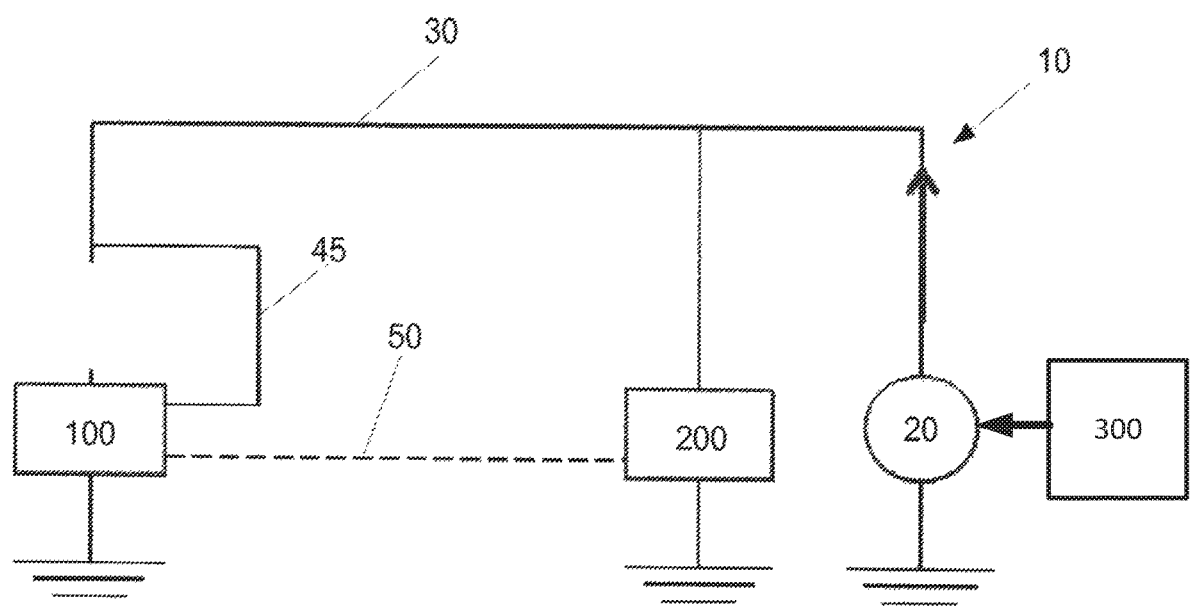
FIG. 2: shows a vehicle onboard power supply system in a fault state.

FIG. 2 shows a state of the onboard power supply system 10 when the battery 40 has a high impedance. This is illustrated in such a way that the battery 40 is no longer present in FIG. 2.

All of the components including the battery sensor 100 continue to be attached here to the onboard power supply system 10, both on the positive side and on the ground side. Although current continues to be supplied by the generator 20, as is illustrated by an arrow in FIG. 2, a current no longer flows from the onboard power supply system 10 through the battery 40 to the ground. The generator 20 is also furthermore controlled to a charge voltage of typically 13.8 V to 14.8 V. Since the battery 40 is also omitted as a filter for the AC components of the generator 20, the onboard power supply system voltage is also superposed by a high AC voltage component. Were the generator 20 no longer to supply a current, the voltage in the onboard power supply system 10 would then collapse. Instead of a generator, any other second current/voltage source, including a second battery, would also be conceivable, of course.

Although the information, described above, in the battery sensor 100 that the current is 0 A and the voltage is 11.5 V to 13 V is, taken by itself, an indication of a fault state, it is typically insufficient to infer a failure of the battery 40. These measurement values can also be set, for example, in the rest state of a vehicle.

In known embodiments, the problem often arises that, given a high impedance of the battery, the resistance becomes so high that it can no longer be handled as part of the conventional digital processing or leads to other problems. However, it is known in principle to calculate the resistance of the battery.

For this purpose, in the battery sensor 100, both the current flowing from the battery 40 to the ground via a measurement resistor, also referred to as a shunt resistor, and the voltage between the onboard power supply system 10 or positive line 30 and ground are detected at a typical frequency of 200 Hz to 8 kHz. Filtering, in particular band-pass filtering, of current and voltage is also typically carried out at a pass frequency of approximately 50 Hz to 800 Hz, said filtering often playing a subordinate role, however. A differential battery resistance is then calculated from changes in current and voltage per sample, for example per millisecond. This can be carried out, for example, in accordance with the following formula:

$$R_{diff} = \frac{\Delta_{1ms}U}{\Delta_{1ms}I}$$

In this case $R_{diff}$: differential resistance, $\Delta_{1\,ms}U$: voltage change in a millisecond, $\Delta_{1\,ms}I$: current change in a millisecond.

If, however, no current is flowing from/to the battery 40, the denominator is zero or only a few milliamperes as a result of the noise of the current channel. As a consequence of the numerical processing of the measurement signals, the calculation of the differential resistance for current changes close to zero is prevented, since in this case very large errors arise or the value range does not cover an infinitely large value.

In the case of execution in accordance with the prior art, the resistance is furthermore not generally calculated every millisecond by division of the voltage change and the current change. A plurality of changes per millisecond are usually used in the calculation before a new resistance is calculated. The differential resistance is calculated, for example, by least-squares analysis. In this case, a plurality of pairs of current and voltage changes are virtually plotted on a graph and a line of best fit is drawn. The gradient typically corresponds to the resistance.

According to an aspect of the invention, a differential conductance is now calculated instead of the differential resistance. This can be carried out in accordance with the following formula:

$$\text{Conductance}_{diff} = \frac{\Delta_{1ms}I}{\Delta_{1ms}U}$$

In this case

Conductance$_{diff}$: differential conductance.

If the conductance is below a threshold or a conductance threshold value, it can then be assumed that the connection between the measurement resistor or shunt resistor and the onboard power supply system 10 has a high impedance.

The conductance is thus calculated now and used as criterion for a battery failure. This conductance can be transmitted to the superordinate control apparatus 200 via the connecting line 50, which control apparatus can then ensure that an internal combustion engine or generator is no longer subsequently disabled. Breakdowns during disabling of the internal combustion engine on account of an activated stop-start function are further minimized as a result thereof.

The conductance can likewise be calculated by means of a least-squares analysis. To this end, in the virtual graph, the x-axis and the y-axis are interchanged with one another. The gradient then corresponds to the conductance. The calculation of the conductance for voltage changes close to zero is prevented (avoidance of a division by zero) in a manner equivalent to the calculation of the resistance.

A further positive configuration is the combination of both methods:

calculation of the resistance for significant current changes, calculation of the conductance for significant voltage changes.

For resistances in the normal range, for example 3 mΩ to 50 mΩ, the final resistance could also be calculated from averaging of the resistance and the conductance. This can be carried out, for example, in accordance with the following formula:

$$R = \frac{R_{diff} \frac{1}{\text{Conductance}_{diff}}}{2}$$

The same also applies for the conductance, in particular if it is not close to zero:

$$\text{Conductance} = \frac{\text{Conductance}_{diff} + \frac{1}{R_{diff}}}{2}$$

Furthermore, the resistance could be set numerically to the maximum value, for example hex FFFF, if the conductance assumes values below a threshold.

Both this maximum value of the resistance (hex FFFF) and also a flag (as the result of the comparison between the calculated conductance and the threshold) can then be transmitted via the connecting line 50 or LIN.

Mentioned steps of the method according to an aspect of the invention can be executed in the indicated order. However, they can also be executed in a different order. In one of its embodiments, for example with a specific combination of steps, the method according to an aspect of the invention can be executed in such a way that no further steps are executed. However, in principle, further steps can also be executed, even steps of a kind which have not been mentioned.

The claims that are part of the application do not represent any dispensing with the attainment of further protection.

If it turns out in the course of proceedings that a feature or a group of features is not absolutely necessary, then the applicant aspires right now to a wording for at least one independent claim that no longer has the feature or the group of features. This may be, by way of example, a subcombination of a claim present on the filing date or may be a subcombination of a claim present on the filing date that is limited by further features. Claims or combinations of features of this kind requiring rewording can be understood to be covered by the disclosure of this application as well.

It should further be pointed out that configurations, features and variants of aspects of the invention that are described in the various embodiments or exemplary embodiments and/or shown in the figures are combinable with one another in any way. Single or multiple features can be interchanged with one another in any way. Combinations of features arising therefrom can be understood to be covered by the disclosure of this application as well.

Back-references in dependent claims are not intended to be understood as dispensing with the attainment of independent substantive protection for the features of the back-referenced subclaims. These features can also be combined with other features in any way.

Features that are disclosed only in the description or features that are disclosed in the description or in a claim only in conjunction with other features may fundamentally be of independent significance essential to aspects of the invention. They can therefore also be individually included in claims for the purpose of distinction from the prior art.

The invention claimed is:

1. A method for determining a fault state of a battery or the connection points thereof to an onboard power supply system, the method comprising:
    periodically measuring, by a battery sensor, voltage samples of a voltage change of the battery,
    periodically measuring, by the battery sensor, current samples of a current change of the battery,
    calculating, by a control apparatus, for each of the voltage samples and for each of the current samples, a differential conductance, and
    ascertaining, by the control apparatus, the fault state when the differential conductance undershoots a conductance threshold value.

2. The method as claimed in claim 1,
    wherein the fault state corresponds to a failure or a high-impedance state of the battery or the connection lines thereof.

3. The method as claimed in claim 2, wherein the method is carried out in a battery sensor, which is connected to the battery.

4. The method as claimed in claim 1,
    wherein the method is carried out in a battery sensor, which is connected to the battery.

5. The method as claimed in claim 1,
    wherein the voltage change and the current change, are measured over an identical period of time.

6. The method as claimed in claim 1,
    wherein the voltage change is calculated as the difference between a second voltage value and a first voltage value measured temporally before said second voltage value;
    and/or
    wherein the current change is calculated as the difference between a second current value and a first current value measured temporally before said second current value.

7. The method as claimed in claim 1,
    wherein the current change and/or the voltage change are measured at a frequency between 50 Hz and 20 kHz.

8. The method as claimed in claim 1,
    wherein the differential conductance is calculated by division of the current change by the voltage change.

9. The method as claimed in claim 1,
    wherein the differential conductance is calculated by means of a least-squares analysis over a plurality of current changes and/or voltage changes.

10. The method as claimed in claim 1,
    wherein a disabling of an internal combustion engine is deactivated in response to the ascertainment of the fault state.

11. The method as claimed in claim 1,
    wherein the differential conductance is calculated only when the voltage change is above a voltage change threshold value.

12. The method as claimed in claim 1,
    wherein a differential resistance is calculated based on the current change and the voltage change when the current change is above a current change threshold value, and
    wherein the fault state is ascertained when the differential resistance exceeds a resistance threshold value.

13. The method as claimed in claim 12,
    wherein a final differential resistance is calculated by addition of the differential resistance and the inverse of the differential conductance and division of the result by the number 2.

14. The method as claimed in claim 12,
    wherein a final differential conductance is calculated by addition of the differential conductance and the inverse of the differential resistance and division of the result by the number 2.

15. A battery sensor, which is designed to be connected to a battery and also to a vehicle chassis, and which is configured to carry out a method as claimed in claim 1.

16. A vehicle onboard power supply system, comprising:
    a battery,
    a battery sensor as claimed in claim 15 connected to the battery, and
    a generator, which is driven by an internal combustion engine,
    wherein the battery, the battery sensor and the generator have a common positive line and also have a common ground.

17. The method as claimed in claim 1, wherein the current change and/or the voltage change are measured at a frequency between 200 Hz and 8 kHz.

18. The method as claimed in claim 1, wherein the current change and/or the voltage change are measured at a frequency of about 1 kHz.

* * * * *